United States Patent [19]
Blake et al.

[11] Patent Number: 6,023,331
[45] Date of Patent: Feb. 8, 2000

[54] FIBER OPTIC INTERFEROMETRIC SENSOR AND METHOD BY ADDING CONTROLLED AMOUNTS OF CIRCULAR BIREFRINGENCE IN THE SENSING FIBER

[75] Inventors: James N. Blake, College Station; Shayne X. Short, Hearne, both of Tex.

[73] Assignee: The Texas A&M University System, College Station, Tex.

[21] Appl. No.: 08/880,111

[22] Filed: Jun. 19, 1997

[51] Int. Cl.[7] .................................................. G01B 9/02
[52] U.S. Cl. ..................................... 356/345; 250/227.27
[58] Field of Search ................................... 356/345, 350, 356/351; 250/227.19, 227.27; 385/12, 14; 324/96

[56] References Cited

U.S. PATENT DOCUMENTS

| | | | |
|---|---|---|---|
| 4,372,685 | 2/1983 | Ulrich | ...................................... 356/350 |
| 4,545,682 | 10/1985 | Greenwood . | |
| 4,578,639 | 3/1986 | Miller . | |
| 4,613,811 | 9/1986 | Vaerewyck et al. . | |
| 4,615,582 | 10/1986 | Lefevre et al. . | |
| 4,733,938 | 3/1988 | Lefevre et al. . | |
| 4,894,608 | 1/1990 | Ulmer, Jr. . | |
| 4,947,107 | 8/1990 | Doerfler et al. . | |
| 4,973,899 | 11/1990 | Jones et al. . | |
| 5,034,679 | 7/1991 | Henderson et al. . | |
| 5,051,577 | 9/1991 | Lutz et al. . | |
| 5,056,885 | 10/1991 | Chinn . | |
| 5,063,290 | 11/1991 | Kersey . | |
| 5,157,461 | 10/1992 | Page . | |
| 5,181,078 | 1/1993 | Lefevre et al. . | |
| 5,270,791 | 12/1993 | Lefevre et al. . | |
| 5,297,436 | 3/1994 | Chan et al. . | |
| 5,644,397 | 7/1997 | Blake | ...................................... 356/345 |

FOREIGN PATENT DOCUMENTS

| | | |
|---|---|---|
| 28 35 794 | 2/1980 | Germany . |
| 19517128 | 11/1996 | Germany . |
| 2 190 744 | 11/1987 | United Kingdom . |

OTHER PUBLICATIONS

R.T. de Carvalho, J. Blake, and G. Sanders, "Sagnac Interferometers for Accurate Measurements of True Nonreciprocal Effects", *SPIE*, vol. 2070, pp. 264–269.

Kent B. Rochford, Gordon W. Day, and Peter R. Forman, "Polarization Dependence of Response Functions in 3×3 Sagnac Optical Fiber Current Sensors", *Journal of Lightwave Technology*, vol. 12, No. 8, Aug. 1994, pp. 1504–1509.

P.A. Nicati and Ph. Robert, "Stabilised Current Sensor Using Sagnac Interferometer", *IOP Publishing Ltd.*, 1988, pp. 791–796.

H. Taylor, "Fiber Sensors: 2", *U.S. Naval Research Laboratory*, Apr. 29, 1981, pp. 128–130.

P.A. Nicati and Ph. Robert, "Stabilized Sagnac Optical Fiber Current Sensor Using One Phase and Two Amplitude Modulations", *Swiss Federal Institute of Technology of Lausanne*, pp. 402–405.

I.G. Clarke, D. Geake, I.M. Bassett, S.B. Poole, and A.D. Stokes, "A Current Sensor Using Spun Birefringent Fibre in a Sagnac Configuration", *OFTC, University of Sydney, Australia*, pp. 167–170.

A. Yu and A.S. Siddiqui, "A Theoretical and Experimental Investigation of a Practicable Fibre Optic Current Sensor Using Sagnac Interferometer", *Department of Electronic Systems Engineering, University of Essex*, pp. 289–292.

(List continued on next page.)

*Primary Examiner*—Samuel A. Turner
*Attorney, Agent, or Firm*—Baker & Botts, L.L.P.

[57] ABSTRACT

A fiber optic interferometric sensor (10, 70) includes a sensing fiber (32, 92) which forms a closed optical path around a current-carrying conductor (44, 94). The sensing fiber (32, 92) has a predetermined number of twists which causes a predetermined amount, T, of circular rotation of the polarization state of the light waves traveling on the optical path, thereby reducing a scale factor error introduced by linear birefringence in the sensing fiber.

27 Claims, 2 Drawing Sheets

OTHER PUBLICATIONS

L.R. Veeser and G.W. Day, "Faraday Effect Current Sensing Using a Sagnac Interferometer With a 3×3 Coupler", *National Institute of Standards and Technology*, pp. 325–328.

P. Akhavan Leilabady, A.P. Wayte, M. Berwick, J.D.C. Jones, and D.A. Jackson, "A Pseudo–Reciprocal Fibre–Optic Faraday Rotation Sensor: Current Measurement and Data Communication Applications", *Elsevier Science Publishers B.V.*, pp. 173–176.

R.A. Bergh, H.C. Lefevre, and H.J. Shaw, "Geometrical Fiber Configuration for Isolators and Magnetometers", *Fiber–Optic Rotation Sensors and Related Technologies*, Springer Series in Optical Sciences 32, 1982, pp. 111–116.

R.T. de Carvalho and J. Blake, "Simultaneous Measurement of Electric and Magnetic Fields Using a Sagnac Interferometer", Texas A&M University, College Station, Texas.

F. Maystre, et al., "Magneto–optic Current Sensor Using a Helical Fiber Fabry–Perot Resonator", Springer Proceedings in Physics, vol. 44, 1989.

J.N. Ross, "The rotation of the polarization in low birefringence monomode optical bivres due to geometric effects", Qpitcal and Quantum Electronics 16, pp. 455,461, 1984.

J. Blake, et al., "In–Line Sagnac Interferometer Current Sensor," 1995 IEEE Transactions on Power Delivery, No. 1, Jan., 1996.

Deeter, Merritt N., "Fiber–optic Faraday–effect magnetic–field sensor based on flux concentrators," Applied Optics, vol. 35, No. 1, Jan. 1, 1996.

Frosio, Guido and Rne Dandliker, "Reciprocal Reflection Interferometer for a Fiber–Optic Faraday Current Sensor", *Applied Optics*, vol. 33, No. 25, pp. 6111–6122. Sep. 1994.

FIBER OPTIC INTERFEROMETRIC SENSOR AND METHOD BY ADDING CONTROLLED AMOUNTS OF CIRCULAR BIREFRINGENCE IN THE SENSING FIBER

RELATED PATENT APPLICATION

This patent application is related to U.S. patent application titled "Fiber Optic Interferometric Current and Magnetic Field Sensor," Ser. No. 08/620,121, and filed on Mar. 26, 1996 by James N. Blake, which is a continuation of application Ser. No. 08/320,734, filed Oct. 7, 1994 of the same title and inventor, now abandoned.

TECHNICAL FIELD OF THE INVENTION

This invention is related in general to the field of fiber optic sensors. More particularly, the invention is related to an improved fiber optic interferometric sensor and method therefor.

BACKGROUND OF THE INVENTION

Sagnac interferometer type current sensors operate by measuring the Faraday effect-induced phase shift of circularly polarized light waves traveling in a closed path around a current carrying wire. Fiber optic current sensors are advantageous over iron-core current transformers, since fiber optic sensors are non-conductive and light weight. Further, fiber optic sensors do not exhibit hysteresis and provide a much larger dynamic range and frequency response. An in-line and a loop version of the fiber optic interferometric sensor are described in detail in allowed U.S. patent application titled "Fiber Optic Interferometric Current and Magnetic Field Sensor," Ser. No. 08/620,121, and filed on Mar. 26, 1996 by James N. Blake, incorporated herein by reference.

However, linear birefringence in the sensing region of the fiber optic sensor may cause large scale factor errors. The linear birefringence may be introduced by imperfections in the fiber, such as internal asymmetry. Linear birefringence is also introduced by the bending of the fiber around the current-carrying conductor in the sensing region. Therefore, it is nearly impossible to eliminate the linear birefringence without annealing the fiber. Further, because the linear birefringence and therefore the scale factor error varies with temperature and other environmental variables, it is difficult to predict and correct for it with sufficient accuracy.

SUMMARY OF THE INVENTION

Accordingly, there is a need for an improved fiber optic interferometric sensor that has greatly reduced or eliminated the effects of linear birefringence-induced scale factor error.

In accordance with the present invention, an improved fiber optic interferometric sensor is provided which eliminates or substantially reduces the disadvantages associated with prior devices caused by linear birefringence.

In one aspect of the invention, a fiber optic interferometric sensor includes a sensing fiber which forms a closed optical path around a current-carrying conductor. The sensing fiber has a predetermined number of twists which causes a predetermined amount, T, of circular rotation of the polarization state of the light waves traveling on the optical path, thereby reducing a scale factor error introduced by linear birefringence in the sensing fiber.

In another aspect of the invention, a fiber optic interferometric sensor includes a sensing fiber having a circular birefringence such that the polarization state of the light traveling therein is rotated by T, where tan 2T=2T for an in-line sensor or tan T=T for a loop sensor.

In another aspect of the invention, a method of forming a sensing fiber for a fiber optic interferometric sensor includes the steps of adding a predetermined amount of circular birefringence to the sensing fiber, and forming a closed path around a current-carrying conductor with the sensing fiber.

In yet another aspect of the invention, a method of forming a sensing fiber for a fiber optic interferometric sensor includes the steps of winding a sensing fiber around a generally circular hoop and forming a closed path around a current-carrying conductor.

A technical advantage of the present invention is the reduction or elimination of scale factor errors introduced by linear birefringence in the sensing fiber. The sensing fiber is twisted only a small number of times to achieve a circular birefringence sufficient to nullify the scale factor errors.

BRIEF DESCRIPTION OF THE DRAWINGS

For a better understanding of the present invention, reference may be made to the accompanying drawings, in which.

DETAILED DESCRIPTION OF THE INVENTION

Figure 1:
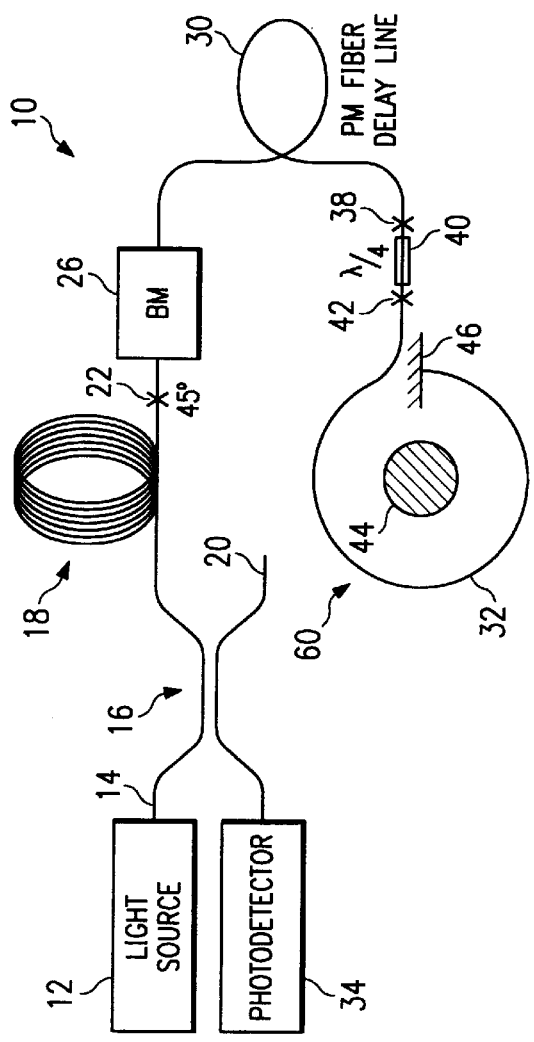
FIG. 1 is a schematic diagram of an in-line fiber optic interferometric current sensor according to the teachings of the present invention.

The preferred embodiments of the present invention are illustrated in FIGS. 1–4, like reference numerals being used to refer to like and corresponding parts of the various drawings.

Referring to FIG. 1, a current sensor 10 constructed according to the teachings of the present invention comprises a broadband light source 12, which introduces a broadband light having multiple optical frequency components into a optic fiber pigtail 14. Optic fiber pigtail 14 is preferably a length of polarization maintaining fiber. Polarization maintaining fiber pigtail 14, is joined to a polarization maintaining beam splitter or directional coupler 16 where a portion of the light is directed to a polarizer 18 and the remaining light is terminated at a non-reflective termination point 20. The light beam passes through polarizer 18, which linearly polarizes the light. The eigen-axes of polarization maintaining fiber pigtail 14, polarization maintaining beam splitter 16, and polarizer 18 are aligned to one another and to the principle axis of light source 12, so as to ensure maximum light input into the sensing region. Polarization cross-coupling points caused by any misalignment of these axes, in combination with an imperfect polarizer, may result in the presence of small offsets in the current measurement and should be avoided as much as possible.

After the light passes through polarizer 18, it is divided substantially equally into X and Y light waves by a 45° splice 22 into the two eigen-axes, X and Y respectively, of a birefringence modulator pigtail 24. Birefringence modulator pigtail 24 is a section of polarization maintaining fiber of sufficient length to depolarize the light passing through it. Birefringence modulator pigtail 24 is connected to a birefringence modulator 26, the X and Y eigen axes of these two components being aligned. Birefringence modulator 26 may be an integrated optics waveguide formed on Ti-indiffused LiNbO$_3$ with metallic electrodes surrounding the waveguide. Alternatively, a piezo-electric modulator may also be used. A voltage applied across the electrodes alters the birefringence of the waveguide. A modulation signal generated by a waveform generator (not shown) is applied to the electrodes of birefringence modulator 26 to dither or phase modulate the light beams. The modulation signal may be a variety of forms including, for example, sine wave modulation, square wave modulation, triangle wave modulation, serrodyne modulation, sawtooth modulation, and other suitable periodic waveforms. The modulation signal may also be a combination of a ramp function and a periodic waveform.

After the light is modulated in birefringence modulator 26, it enters a predetermined length of polarization maintaining fiber bus 30. The principle axes of polarization maintaining fiber bus 30 are aligned to the principle axes of the birefringence modulator 26. Polarization maintaining fiber bus 30 serves two purposes. The first is to carry the light to a passive sensing medium or sensing fiber 32, which typically is remotely located from the active elements such as light source 12 and birefringence modulator 26. The second purpose of polarization maintaining fiber bus 30 is to provide a time delay of sufficient length that the modulation signal applied at birefringence modulator 26 substantially changes its value during the time it takes for the light to propagate from birefringence modulator 26 to sensing fiber 32 and return. Ideally, the fundamental dither frequency of the waveform applied to birefringence modulator 26 is ½τ or odd multiples thereof, where τ is the propagation time for the light waves to travel from birefringence modulator 26 through sensing medium 32 and back.

After passing through polarization maintaining fiber bus 30, the light goes through a 45° splice 38, a zero or multiple order quarter wave plate 40 set at 45° to the principle axes of the polarization maintaining fiber bus 30, and a single mode fiber splice 42. The purpose of quarter wave plate 40 is to convert the orthogonally linearly polarized light from each of the principle axes of polarization maintaining fiber bus 30 to circular states of polarization. The quarter wave plate 40 is preferably constructed from a short section of long beat length polarization maintaining fiber, ideally a quarter of a polarization beat length long. An odd multiple of quarter beat lengths of length is also acceptable.

Therefore, two opposingly circularly polarized light waves are generated by quarter waveplate 40. The X light wave from the first principle axis or X axis of polarization maintaining fiber bus 30 is converted to a right hand circularly polarized (RHCP) light wave. The Y light wave from the second principle axis or Y axis of polarization maintaining fiber bus 30 is converted to a left hand circularly polarized (LHCP) light wave. The two circularly polarized light waves then pass through sensing fiber 32 wrapped around a current-carrying wire 44 at different velocities, accumulating a phase difference in proportion to the magnetic field component aligned with sensing fiber 32. Sensing fiber 32 may be constructed from a single mode fiber having a low birefringence per unit length and wound an integral number of turns around current carrying wire 36. For most applications, one to five loops of sensing fiber 32 around wire 44 has been shown to be sufficient.

A reflector 46, such as a mirror or mirrored surface, terminates sensing fiber 32. The light is reflected by mirror 46 and returns through sensing fiber 32 in the other direction. The sense of circular polarization of the light is reversed upon reflection, causing the right hand circularly polarized light wave to be converted to be left hand circularly polarized for its return trip through sensing fiber 32, and vice versa for the left hand circularly polarized light. Since the sense of polarization and the direction of the light are reversed for both light waves during their return trip through sensing fiber 32, the relative differential phase shift. accumulated between them during the first pass through sensing fiber 32 is doubled during the return trip. The total phase shift, $\Delta\phi$, accumulated between the two light waves in the double pass sensing region 60 is thus $\Delta\phi=4VNI$, where V is the Verdet constant of the fiber glass, N is the number of turns of sensing fiber around current carry wire 36 and I is the current flowing in wire 44.

After the light makes its double pass through sensing fiber 32, the light wave that was originally in the first principle axis of polarization maintaining fiber bus 30 returns to bus 30 linearly polarized along its second principle axis, and the light wave that was originally in the second principle axis of polarization maintaining fiber bus 30 returns to bus 30 linearly polarized along its first principle axis. The light waves then pass through birefringence modulator 26 and its pigtail 24 a second time, and are brought together and interfered by 45° splice 22 and polarizer 18. A portion of this light is then coupled to a photodetector 46 via polarization maintaining beam splitter 16. A signal processing electronics circuit 50 coupled to photodetector 46 may be used to recover the non-reciprocal phase shift in the detected signal to provide a measurement output.

Therefore, the two light waves underwent exactly the same polarization evolution throughout the optical circuit, only in reverse order. Because sensing medium 32 is in-line with respect to the optic fiber, it may be seen that the sensing region around wire 36 is positioned at the mid-point of the optical path traversed by both light waves. Therefore, the only phase difference between the two light waves is that generated by the presence of a magnetic field in the sensing region. However, it has been shown that linear birefringence in sensing fiber 32 causes a scale factor error. The linear birefringence may be introduced by internal asymmetry in sensing fiber 32 or bending of the fiber around conductor 44. Because the linear birefringence and therefore the scale factor error vary with temperature changes, it is difficult to predict and eliminate.

Figure 2:
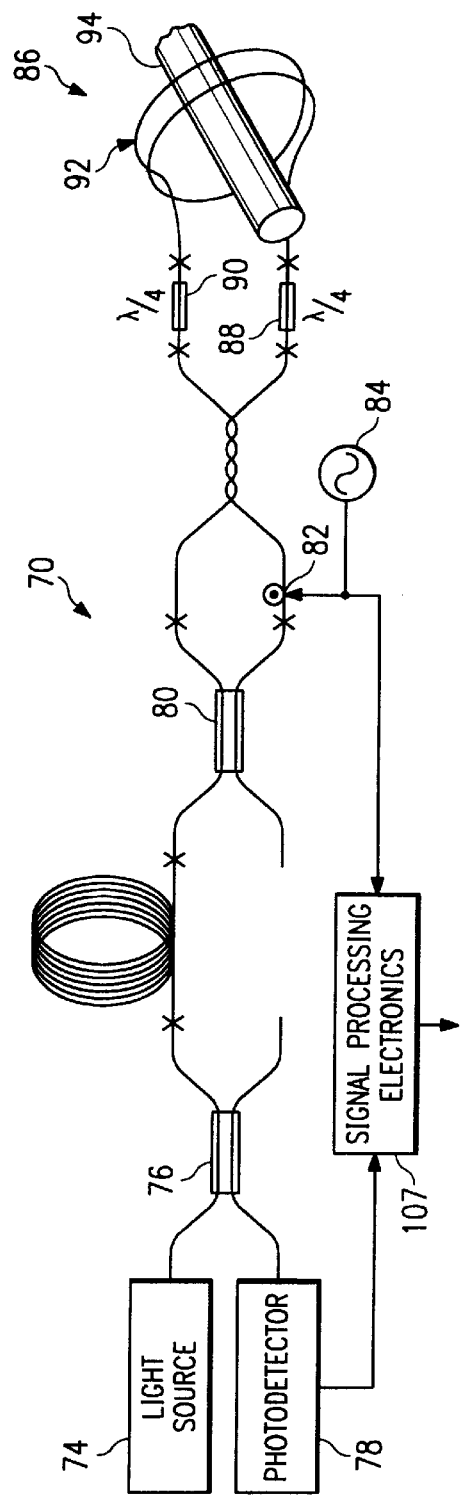
FIG. 2 is a schematic diagram of a loop fiber optic interferometric current sensor according to the teachings of the present invention.

FIG. 2 shows a loop version of a fiber optic interferometric sensor 70 also experiencing the scale factor error introduced by linear birefringence in the sensing fiber. Sensor 70 includes a light source 72 such as a laser diode to generate a broadband light that is coupled into fiber 74. The light passes through a directional coupler and is linearly polarized by a fiber polarizer 78. The linearly polarized light is then coupled into the loop portion of the sensor as two counter-propagating linearly polarized light waves by another directional coupler 80. A phase modulator 82 applies a periodic signal 84 to phase modulate or dither the light waves. Just before the two light waves enter a sensing region 86, they pass through quarter wave plates 88 and 90, respectively, oriented with the principle axes at 45° with respect to the axes of the polarization maintaining fiber. Quarter wave plates 88 and 90 convert the linearly polarized light to circularly polarized light.

Immediately following quarter wave plates 88 and 90 is a sensing fiber 92 preferably made from a low birefringence fiber. Sensing fiber 92 is wrapped around a current-carrying wire 94 one or more times. There is no fundamental advantage of using right or left handed circularly polarized light in the sensing region 86. Exiting sensing region 86, one circularly polarized light wave continues on and passes through quarter wave plate 88, and the other circularly light wave passes through quarter wave plate 90. Quarter wave plates 88 and 90 now convert both light waves back to linearly polarized light aligned with the polarization maintaining fiber 74. The returning light waves pass through directional couplers 80 and 76, and fall on a photodetector 100, which provides an output signal to a signal processor 102. Signal processor 102 then extracts the non-reciprocal phase shift in the detected signal and generates an output indicative of the magnitude of the current flowing in wire 94. However, similar to the in-line sensor, the loop sensor also suffers from errors caused by linear birefringence in the sensing fiber.

It may be shown mathematically that the total birefringence in the sensing fiber for both versions of the fiber optic interferometric sensor may be expressed as the root sum square of the linear and the circular birefringence:

$$\text{TOTAL BIREFRINGENCE} = \sqrt{\text{LINEAR}^2 + \text{CIRCULAR}^2}$$

Therefore, the scale factor introduced by the effects of linear birefringence may be minimized or essentially eliminated if the circular birefringence component is much larger than the linear birefringence component. Fiber optic interferometric sensors 10 and 70 shown in FIGS. 1 and 2 are immune to the effects of circular birefringence because circularly polarized light is used in the sensing region. It has been shown in Bohnert, K. et al., "Field Test of Interferometric Optical Fiber High-Voltage and Current Sensors," Tenth International Conference on Optical Fiber Sensors, Proc. SPIE 2360, 16–19 (1994), that this characteristic is recognized and can be applied to fiber optic interferometric sensors by twisting the optic fiber in the sensing region to a large extent to suppress the effects of linear birefringence. To add and maintain a large number of twists in the optic fiber is impracticable because the tightly-wound fiber will typically creep over time. Further, because linear birefringence and therefore the scale factor error vary with temperature, the error is difficult to predict and to correct for.

According to the teachings of the present invention, a Jones Matrix may be composed for sensing region of the in-line fiber optic interferometric sensor, which represents the polarization evolution of the light in the sensing region from splice 42 to reflector 46:

$$L_S = \begin{bmatrix} A & B \\ -B^* & A^* \end{bmatrix}$$

A represents the transfer function of the light starting in the X polarization state and ending in X; B represents the transfer function of the light starting in the Y polarization state and ending in X; $-B^*$ represents the transfer function of the light starting in the X polarization state and ending in Y; and $A^*$ represents the transfer function of the light starting in the Y polarization state and ending in Y. More particularly, $$A = \cos\sqrt{\left(\frac{\delta}{2}\right)^2 + (F+T)^2} + j\left(\frac{\delta}{2}\right)\sin\frac{\sqrt{\left(\frac{\delta}{2}\right)^2 + (F+T)^2}}{\sqrt{\left(\frac{\delta}{2}\right)^2 + (F+T)^2}}$$

and $$B = (F+T)\sin\frac{\sqrt{\left(\frac{\delta}{2}\right)^2 + (F+T)^2}}{\sqrt{\left(\frac{\delta}{2}\right)^2 + (F+T)^2}}$$

where
  T is the rotation caused by circular birefringence;
  δ is linear birefringence; and
  F is equal to VNI, where V is the Verdet constant, N is the number of fiber turns around the current carrying wire or the number of wire turns around the fiber, and I is the current.

The sensor output, $\Delta\phi_{NR}$, which is the non-reciprocal phase shift accumulated between the two light beams traversing the sensing region, may be stated by:

$$\Delta\Phi_{NR} = arg(E_1) - arg(E_2)$$

$$E_1 = \begin{bmatrix} 0 & 0 \\ 0 & 1 \end{bmatrix}[L_{45°}][L_{\lambda/4}][L_S^T(f \to -f)][L_{mirror}][L_S][L_{\lambda/4}][L_{45°}]\begin{bmatrix} 1 \\ 0 \end{bmatrix}$$

$$E_2 = \begin{bmatrix} 1 & 0 \\ 0 & 0 \end{bmatrix}[L_{45°}][L_{\lambda/4}][L_S^T(f \to -f)][L_{mirror}][L_S][L_{\lambda/4}][L_{45°}]\begin{bmatrix} 0 \\ 1 \end{bmatrix}$$

$$\Delta\Phi_{NR} = -2F\left(\frac{\delta}{2}\right)^2 \sin 2\frac{\sqrt{\left(\frac{\delta}{2}\right)^2 + T^2}}{2\sqrt{\left(\frac{\delta}{2}\right)^2 + T^2}} + \frac{T^2}{\left(\frac{\delta}{2}\right)^2 \cos 2\sqrt{\left(\frac{\delta}{2}\right)^2 + T^2} + T^2}$$

$E_1$ is the wave that arrives at the sensing head polarized in the $\hat{x}$ direction and exits the sensing head polarized in the $\hat{y}$ direction; $E_2$ is the wave that arrives at the sensing head polarized in the $\hat{y}$ direction and exits the sensing head polarized in the $\hat{x}$ direction.

Assuming F is small and therefore ignoring squared and higher order terms of F, the sensor output $\Delta\phi_{NR}$, is -2F, independnet of δ, provided:

$$\frac{\sin 2\sqrt{\left(\frac{\delta}{2}\right)^2 + T^2}}{2\sqrt{\left(\frac{\delta}{2}\right)^2 + T^2}} = \cos 2\sqrt{\left(\frac{\delta}{2}\right)^2 + T^2}$$

or $$\tan 2\sqrt{\left(\frac{\delta}{2}\right)^2 + T^2} = 2\sqrt{\left(\frac{\delta}{2}\right)^2 + T^2}$$

When T>>δ/2,
  tan 2T=2T
which has a first non-zero solution of T=2.247 radians or 128.7°. Therefore, it is desirable to have a circular birefringence such that the polarization state of the light is rotated by T being approximately 128°.

Figure 4:
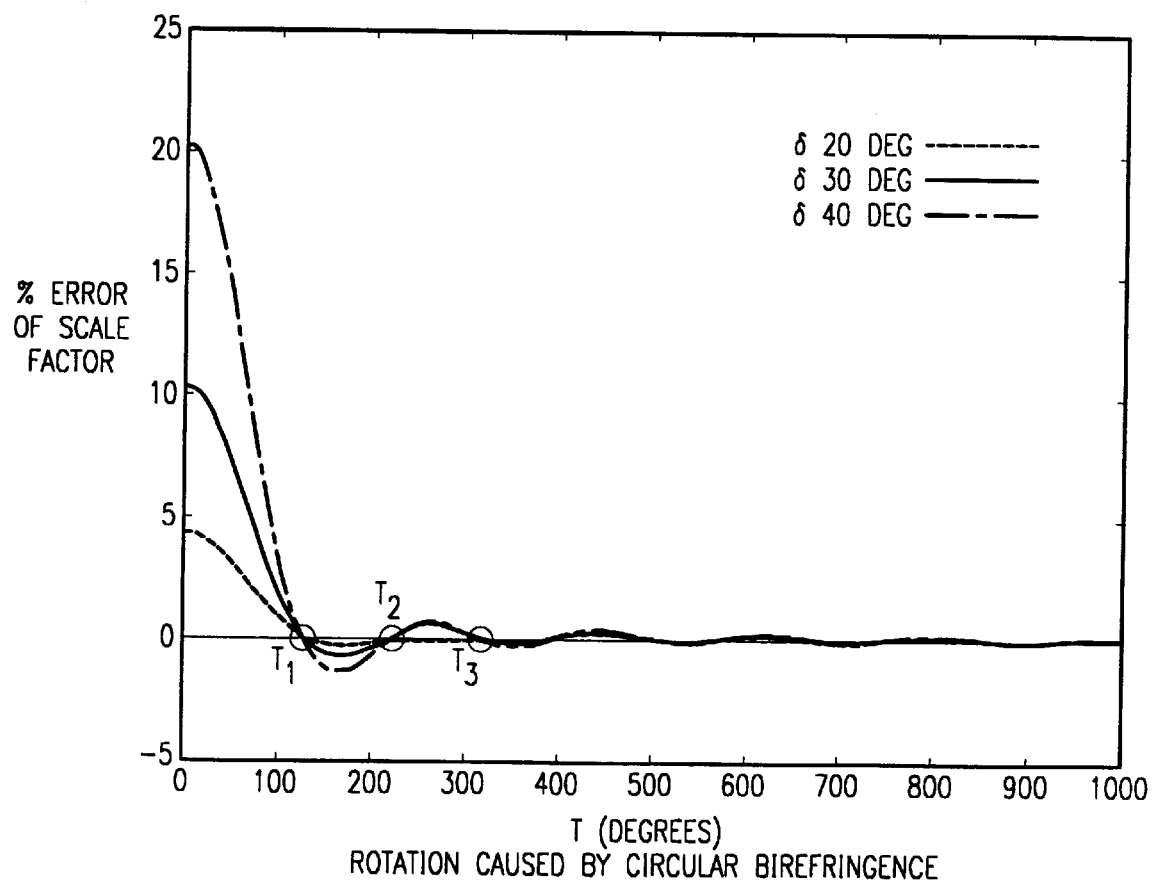
FIG. 4 is a plot of rotation caused by circular birefringence versus scale factor percentage error according to the teachings of the present invention.

Therefore, for a given amount of linear birefringence, the scale factor error is a decaying oscillatory function of the amount of circular birefringence. As shown in the plot of FIG. 4, it may be seen that for a wide range of linear birefringence values, the same amount of circular birefringence suppresses the error. The first three solutions, $T_1$, $T_2$, and $T_3$, where the scale factor error is zero for linear birefringences of 20, 30 and 40 degrees, are shown. Solving for T, it may be seen that the first three solutions are:

$T_1$=2.247 radians or 128.7°

$T_2$=3.8626 radians or 221.3°

$T_3$=5.452 radians or 312.4°

The first three solutions, particularly $T_1$, may be easily achieved with a relatively few number of turns of the optic fiber in the sensing region. For example, to achieve $T_1$=128.7°, only four or five turns of the optic fiber is needed to achieve this value of circular birefringence and therefore effectively eliminate or greatly reduce the scale factor error caused by linear birefringence. It may be also seen from this graph that a large number of twists in the fiber introducing a large amount of circular birefringence also tends to cancel out the effects of linear birefringence. However, it is impracticable to achieve and maintain the such large number of twists in the fiber.

For the loop version of fiber optic interferometric sensor shown in FIG. 2, the scale factor error is also a decaying oscillatory function, values of T which eliminate the effects of linear birefringence are given by solutions to the equation:

$$\tan T = T,$$

It may be seen that the in-line sensor is a double-path device, where the error caused by linear birefringence in the sensing region is experienced twice or doubled. In the loop version, the light travels through the sensing region only once. Therefore, the general solution of interest to suppress linear birefringence in the loop version is tan T=T, where zero scale factor error occurs at:

$T_1$=4.493 radians or 257.4°

$T_2$=7.725 radians or 442.6°

$T_3$=10.904 radians or 624.8° for the first three solutions. Polarization state rotation of approximately 257° may be easily achieved by twisting the fiber approximately 8 to 10 times.

Figure 3:
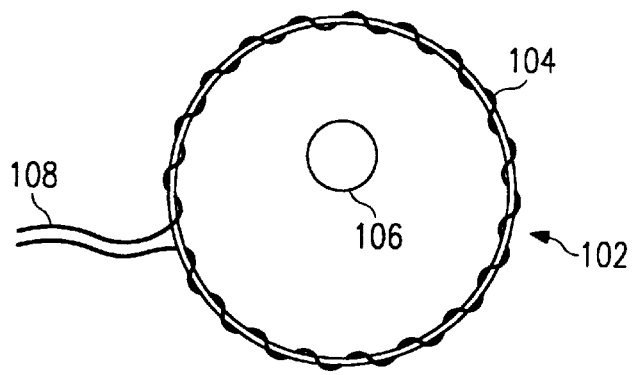
FIG. 3 is a simplified diagram of a helically-wound sensing region according to the teachings of the present invention.

The circular polarization of the light in the sensing fiber rotation may be achieved by a number of ways. The sensing fiber may be twisted by adding rotation along its longitudinal axis a predetermined number of times during sensor installation. The sensing fiber may be twisted by the predetermined number of times during manufacture. Alternative, circular birefringence may be incorporated by using a helical sensing configuration 100, as shown in FIG. 3. In a sensing region of a fiber optic interferometric sensor of the present invention, a generally circular hoop 104 constructed of a nonconductive material such as plastic, fiber glass, plexiglass, or other suitable materials is positioned around a current carrying wire 106. A sensing fiber 108 carrying the sensing light is wound helically around hoop 104. To close the path the light travels around current carrying wire 106, optic fiber 108 is wound around hoop 104 so that it enters and exits sensing region 102 at substantially the same location or very closely together as shown. When used for the in-line sensor, the exit end of the sensing fiber is terminated with a reflector. The geometric torsion τ of the helix is:

$$\tau = \frac{\sin\theta\cos\theta}{Q}$$

where θ is the pitch angle; and

Q is the radius of the helix.

The relationship between T and τ is:

$$T = N\tau$$

where N is the number of turns in the helix. Therefore, the zero scale factor error solutions of the present invention may be achieved by:

$$T = N\frac{\sin\theta\cos\theta}{Q}$$

Thus, by choosing the pitch angle and radius of the helix, the solutions of the in-line and loop sensors, for example 128° and 257°, may be achieved in this manner.

The teachings of the present invention is also applicable to the suppression of linear birefringence in bulk optic current sensors by introducing a predetermined amount of circular birefringence as set forth above.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A fiber optic interferometric sensor, comprising:
    a sensing fiber forming a closed optical path around a current-carrying conductor;
    two circularly polarized light waves traveling on the closed optical path around the current-carrying conductor; and
    the sensing fiber having a specific controlled number of twists and causing a predetermined amount T of circular rotation of the polarization state of the light waves, thereby reducing a scale factor error introduced by linear birefringence in the sensing fiber.

2. The fiber optic interferometric sensor, as set forth in claim 1, wherein the sensing fiber has a circular birefringence rotation T, where tan 2T=2T.

3. The fiber optic interferometric sensor, as set forth in claim 1, wherein the sensing fiber rotates the circular polarization state of the two light waves by approximately 128°.

4. The fiber optic interferometric sensor, as set forth in claim 3, wherein the sensing fiber has less than six twists.

5. The fiber optic interferometric sensor, as set forth in claim 1, wherein the sensing fiber has a circular birefringence rotation T, where tan T=T.

6. The fiber optic interferometric sensor, as set forth in claim 1, wherein the sensing fiber rotates the circular polarization state of the two light waves by approximately 257°.

7. The fiber optic interferometric sensor, as set forth in claim 6, wherein the sensing fiber has 8 to 10 twists.

8. The fiber optic interferometric sensor, as set forth in claim 1, further comprising a generally circular hoop around the current-carrying conductor, and the sensing fiber being wound around the circular hoop in a helical manner and forming a substantially closed path around the conductor.

9. The fiber optic interferometric sensor, as set forth in claim 8, wherein the sensing fiber is wound as a helix having a circular birefringence rotation T:

$$T = N\frac{\sin\theta\cos\theta}{Q}$$

where θ is the pitch angle;
Q is the radius of the helix; and
N is the number of turns in the helix; and tan 2T=2T.

10. The fiber optic interferometric sensor, as set forth in claim 8, wherein the sensing fiber is wound as a helix having a circular birefringence rotation T:

$$T = N\frac{\sin\theta\cos\theta}{Q}$$

where θ is the pitch angle;
Q is the radius of the helix; and
N is the number of turns in the helix; and tan T=T.

11. An in-line fiber optic interferometric sensor, comprising:
a sensing fiber forming a closed optical path around a current-carrying conductor;
two circularly polarized light waves traveling on the closed optical path around the current-carrying conductor; and
the sensing fiber having a specific controlled number of twists and causing a predetermined amount T of circular rotation of the polarization state of the light waves, where tan 2T=2T, thereby reducing a scale factor error introduced by linear birefringence in the sensing fiber.

12. The fiber optic interferometric sensor, as set forth in claim 11, wherein the sensing fiber rotates the circular polarization state of the two light waves by approximately 128°.

13. The fiber optic interferometric sensor, as set forth in claim 11, wherein the sensing fiber has less than six twists.

14. The fiber optic interferometric sensor, as set forth in claim 11, further comprising a generally circular hoop around the current-carrying conductor, and the sensing fiber being wound around the circular hoop in a helical manner and forming a substantially closed path around the conductor.

15. The fiber optic interferometric sensor, as set forth in claim 14, wherein the sensing fiber is wound as a helix having a circular birefringence rotation:

$$T = N\frac{\sin\theta\cos\theta}{Q}$$

where θ is the pitch angle;
Q is the radius of the helix; and
N is the number of turns in the helix.

16. A loop fiber optic interferometric sensor, comprising:
a sensing fiber forming a closed optical path around a current-carrying conductor,
two circularly polarized light waves traveling on the closed optical path around the current-carrying conductor; and
the sensing fiber having a specific controlled number of twists and causing a predetermined amount T of circular rotation of the polarization state of the light waves, where tan T=T, thereby reducing a scale factor error introduced by linear birefringence in the sensing fiber.

17. The fiber optic interferometric sensor, as set forth in claim 16, wherein the sensing fiber rotates the circular polarization state of the two light waves by approximately 257°.

18. The fiber optic interferometric sensor, as set forth in claim 16, wherein the sensing fiber has less than 12 twists.

19. The fiber optic interferometric sensor, as set forth in claim 16, further comprising a generally circular hoop around the current-carrying conductor, and the sensing fiber being wound around the circular hoop in a helical manner and forming a substantially closed path around the conductor.

20. The fiber optic interferometric sensor, as set forth in claim 19, wherein the sensing fiber is wound as a helix having a circular birefringence rotation:

$$T = N\frac{\sin\theta\cos\theta}{Q}$$

where θ is the pitch angle;
Q is the radius of the helix; and
N is the number of turns in the helix.

21. A method of forming a sensing fiber for a fiber optic interferometric sensor, comprising the steps of:
adding a specific controlled amount of circular birefringence to the sensing fiber; and
forming a closed path around a current-carrying conductor with the sensing fiber.

22. The method, as set forth in claim 21, wherein the circular birefringence adding step comprises the step of twisting the sensing fiber to achieve a controlled amount of rotation in the circular polarization state by T, where tan 2T=2T.

23. The method, as set forth in claim 21, wherein the circular birefringence adding step comprises the step of twisting the sensing fiber to achieve a controlled amount of rotation in the circular polarization state by approximately 128°.

24. The method, as set forth in claim 21, wherein the circular birefringence adding step comprises the step of twisting the sensing fiber to achieve a controlled amount of rotation in the circular polarization state by T, where tan 2T=2T.

25. The method, as set forth in claim 21, wherein the circular birefringence adding step comprises the step of twisting the sensing fiber to achieve a controlled amount of rotation in the circular polarization state by approximately 257°.

26. The method, as set forth in claim 21, wherein the circular birefringence adding step comprises the step of winding the sensing fiber around a circular hoop a specific number of times in a helical manner and forming a substantially closed path around the conductor.

27. The method, as set forth in claim 26, wherein the sensing fiber winding step comprises the step of winding the circular hoop as a helix having a circular birefringence rotation:

$$T = N\frac{\sin\theta\cos\theta}{Q}$$

where θ is the pitch angle;
Q is the radius of the helix; and
N is the number of turns in the helix.

* * * * *